METHOD OF MANUFACTURING SEMICONDUCTOR DEVICES

Filed May 1, 1963 4 Sheets-Sheet 1

INVENTORS
KOICHI IKEDA
MASAO SUZUKI
TSUTOMU MAJIMA
SHIGERU TSUJI
KATSUO SATO
KOICHI URUSHIDA

BY Hopgood & Calimafde
ATTORNEY

METHOD OF MANUFACTURING SEMICONDUCTOR DEVICES

Filed May 1, 1963 4 Sheets-Sheet 2

INVENTORS
KOICHI IKEDA
MASAO SUZUKI
TSUTOMU MAJIMA
SHIGERU TSUJI
KATSUO SATO
KOICHI URUSHIDA
BY
Hapgood & Calimafde
ATTORNEY

METHOD OF MANUFACTURING SEMICONDUCTOR DEVICES

Filed May 1, 1963 4 Sheets-Sheet 3

INVENTORS
KOICHI IKEDA
MASAO SUZUKI
TSUTOMU MAJIMA
SHIGERU TSUJI
KATSUO SATO
KOICHI URUSHIDA

BY Hapgood & Calimafde
ATTORNEY

METHOD OF MANUFACTURING SEMICONDUCTOR DEVICES

Filed May 1, 1963 4 Sheets-Sheet 4

INVENTORS
KOICHI IKEDA
MASAO SUZUKI
TSUTOMU MAJIMA
SHIGERU TSUJI
KATSUO SATO
KOICHI URUSHIDA

BY Hopgood + Calimafde
ATTORNEY

United States Patent Office 3,171,187

Patented Mar. 2, 1965

3,171,187

METHOD OF MANUFACTURING SEMICONDUCTOR DEVICES

Koichi Ikeda, Masao Suzuki, Tsutomu Majima, Shigeru Tsuji, Katsuo Sato, and Koichi Urushida, all of Tokyo, Japan, assignors to Nippon Electric Company Limited, Tokyo, Japan, a corporation of Japan Filed May 1, 1963, Ser. No. 277,239
Claims priority, application Japan, May 4, 1962, 37/18,424
8 Claims. (Cl. 29—25.3)

This invention relates generally to the manufacture of semiconductor devices and more particularly to the mass production of semiconductor devices.

In the past, semiconductor devices have been manufactured individually, but this method had the major drawback of being expensive and time consuming, particularly in the case of complex semiconductor devices, which require many steps in their fabrication, or small semiconductor devices, which are hard to handle.

Accordingly, one object of this invention is to provide a simple and inexpensive method of mass producing semiconductor devices.

Another object of this invention is to provide a convenient and accurate method of mass producing semiconductor devices.

Other objects and advantages of this invention will be apparent to those skilled in the art from the following description of several specific embodiments thereof, as illustrated in the attached drawings, in which.

Figures 2A, 2B, 2C, 2D, 2E, 2F, 3A:
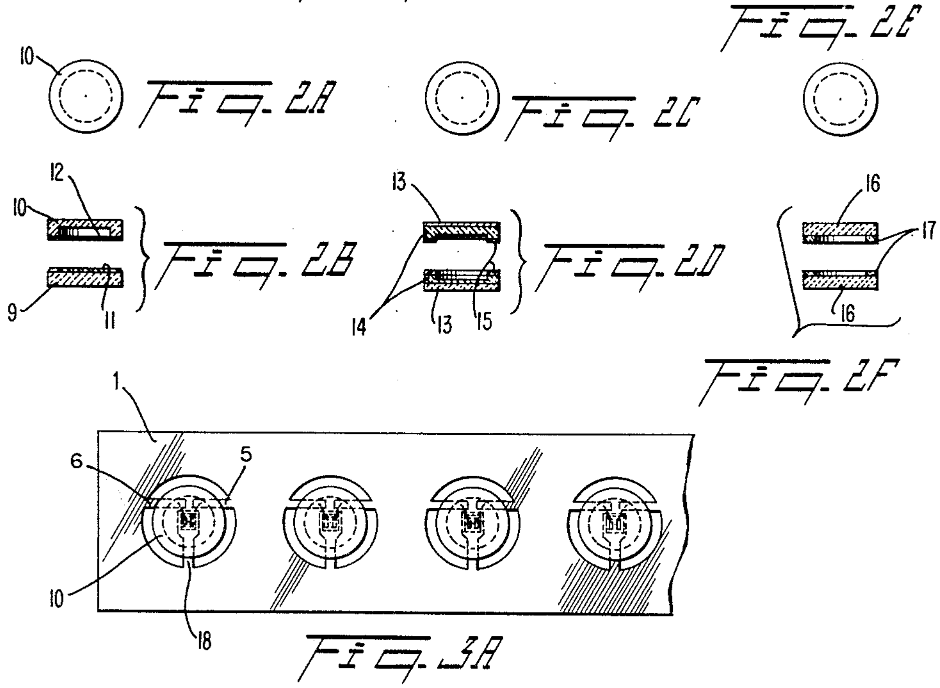
FIG. 2A is a plan view of a first cap means for hermetically sealing the semiconductor devices of this invention.

FIG. 2A' is an elevation section of the cap means shown in FIG. 2A;

FIG. 2B is a plan view of a second cap means for hermetically sealing the semiconductor devices of this invention;

FIG. 2B' is an elevation section of the cap means shown in FIG. 2B.

Figure 3B:
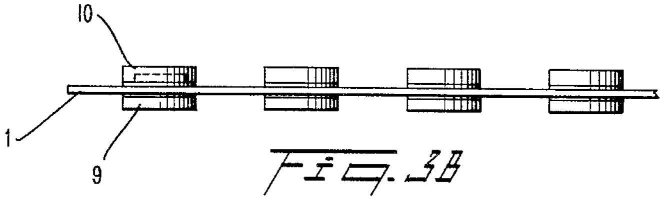
Figures 4A, 4B:
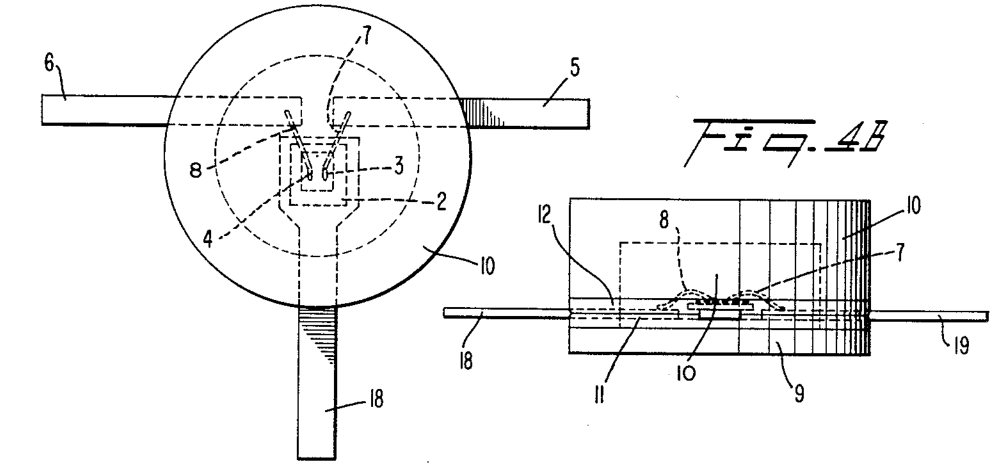
Figure 5:
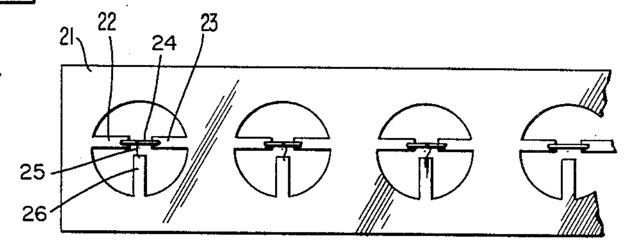
Figure 6A:
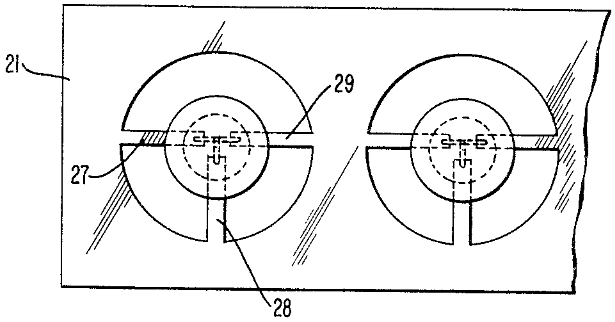
Figure 6B:
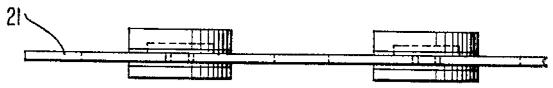
Figure 7A:
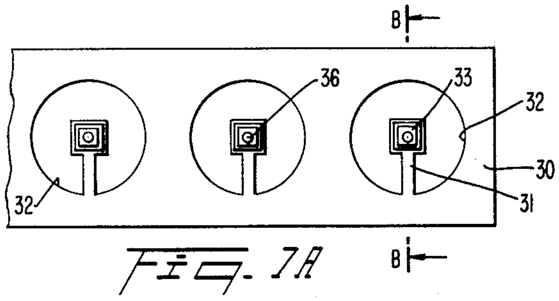
Figure 7B:
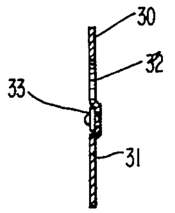
Figure 8A:
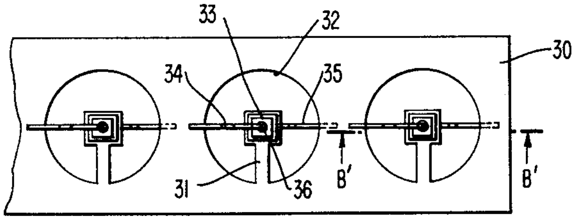
Figure 8B:
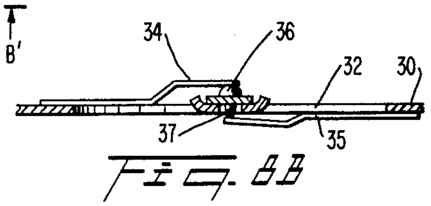
Figure 9A:
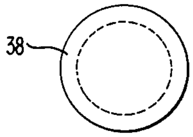
Figure 9C:
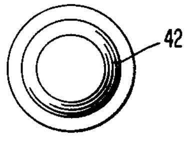
Figure 9B:
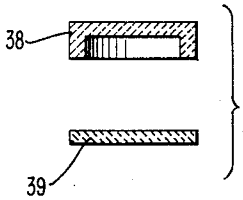
Figure 9D:
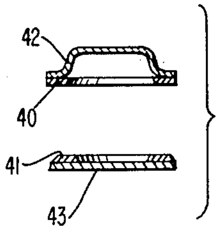
Figure 10:
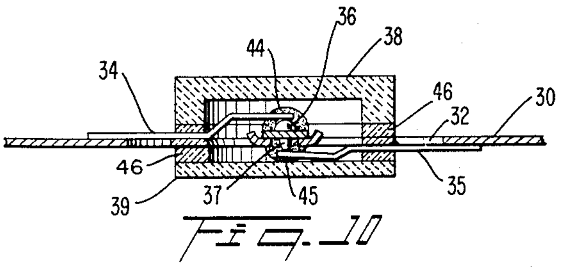

FIG. 2C is a plan view of a third cap means for hermetically sealing the semiconductor devices of this invention;

FIG. 2C' is an elevation section of the cap means shown in FIG. 2C;

FIG. 3A is a plan view of a hermetically sealed embodiment of this invention;

FIG. 3B is an elevation view of the embodiment shown in FIG. 3A;

FIG. 4A is a plan view of an individual semiconductor device cut from the embodiment of FIG. 3A;

FIG. 4B is an elevation view of an individual semiconductor device cut from the embodiment of FIG. 3A;

FIG. 5 is a plan view of a third embodiment of the invention;

FIG. 6A is a plan view of a fourth embodiment of this invention;

FIG. 6B is an elevation view of the embodiment shown in FIG. 6A;

FIG. 7A is a plan view of a fifth embodiment of the invention;

FIG. 7B is an elevation section taken on the line B—B of FIG. 7A;

FIG. 8A is a plan view of a sixth embodiment of the invention;

FIG. 8B is an elevation section taken on the line B—B of FIG. 8A;

FIG. 9A is a plan view of a fourth cap means for hermetically sealing the semiconductor devices of this invention;

FIG. 9A' is an elevation section of the cap means shown in FIG. 9A;

FIG. 9B is a plan view of a fifth cap means for hermetically sealing the semiconductor devices of this invention;

FIG. 9B' is an elevation section of the cap means shown in FIG. 9B;

FIG. 10 is an elevation section of a seventh embodiment of the invention; and

Figure 11:
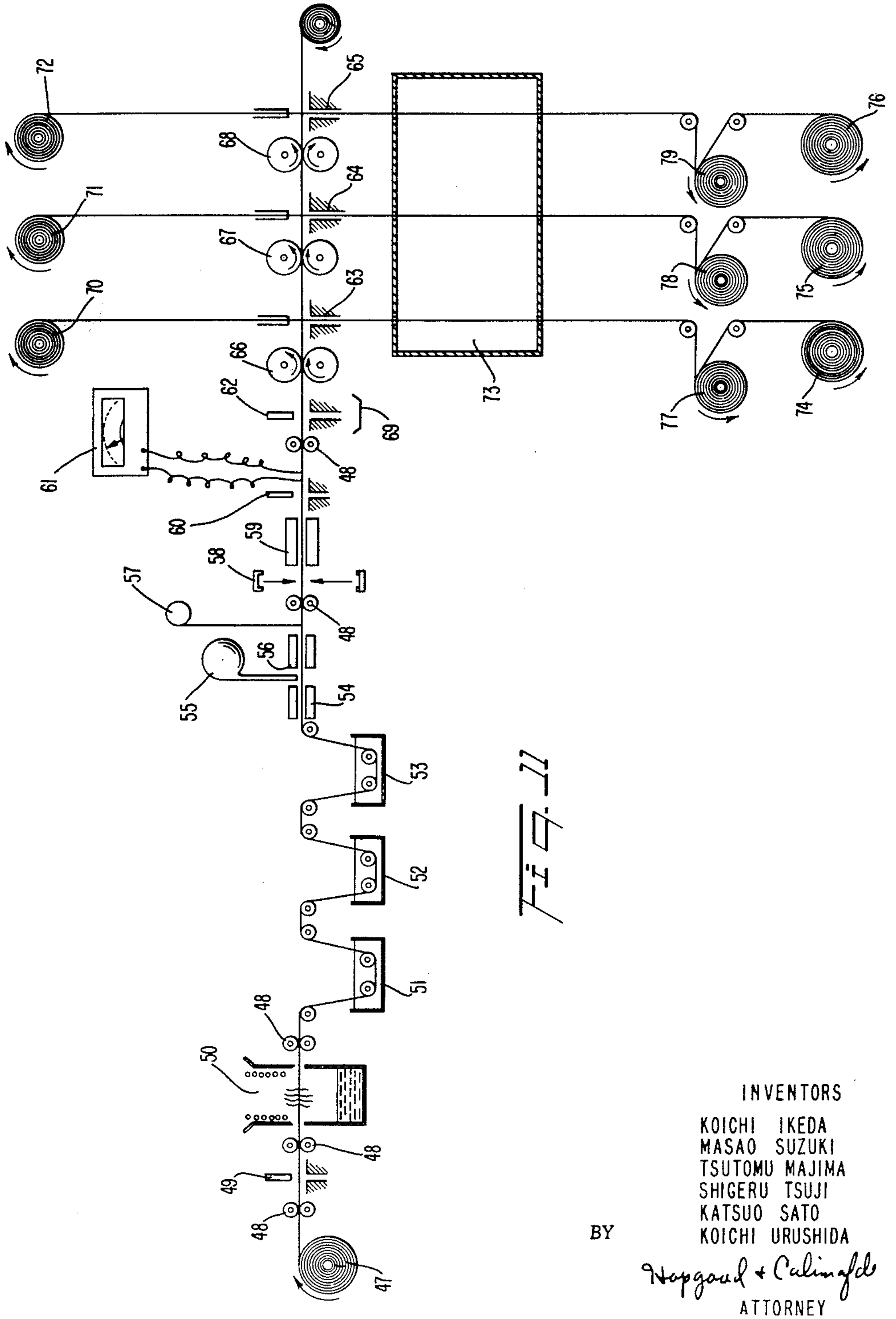

FIG. 11 is a schematic drawing showing one illustrative mass production method of this invention.

In general terms, the method of this invention comprises the steps of (1) forming openings having inwardly projecting fingers in a conducting material, (2) attaching semiconductor materials to said inwardly projecting fingers, and (3) removing the inwardly projecting fingers from the conducting material. The method of this invention also preferably includes the step of hermetically sealing the semiconductor material with a cap means before removing the inwardly projecting fingers from the conducting material. The invention will, however, be better understood from the following description of several specific embodiments thereof, as illustrated in the drawings.

Figures 1A, 1B:
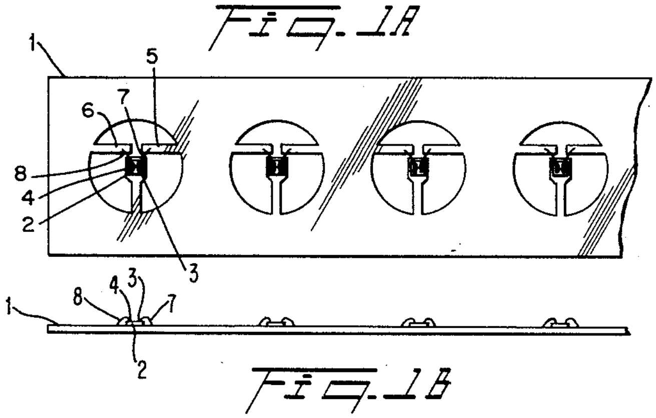
FIG. 1A is a plan view of an illustrative embodiment of the invention.
FIG. 1B is an elevation view of the embodiment shown in FIG. 1A.

FIGS. 1A and 1B show a strip of metal plate 1 having a plurality of openings each containing three inwardly projecting fingers which form two terminals and one holder for a semiconductor element. Diffused type transistor element 2 is affixed to the holder with an emitter electrode 3 and a base electrode 4 connected by lead wires 7 and 8 respectively to the corresponding fingers 5 and 6. FIGS. 2A and 2A' show a disc-shaped container 9 and a matching dish-shaped contained 10 which are made of ceramic-type material and which have been provided on their peripheries with glass linings 11 and 12, respectively. The ceramic-type material may include glass, porcelain, devitro-ceramic and of course ceramics of various other types. The containers 9 and 10 form a cap means for hermetically sealing the semiconductor devices of this invention, as will be explained in detail below. FIGS. 2B and 2B' show disc-shaped metal containers 13 having on the respective interior surfaces and peripheries glass linings 14 and 15. The lining 14 is preferably of a high melting point glass and the lining 15 a low melting point glass. FIGS. 2C and 2C' show disc-shaped ceramic containers 16 having on the respective peripheries glass linings 17. As shown in FIG. 3, any of the above noted containers may be placed on both sides of the strip of metal plate so as to case the semiconductor element attached thereto as shown in FIGURE 1, and may then be hermetically sealed together by heat-fusing the glass lined peripheries. In the case of the multi-layer glass linings of FIG. 2B', the low melting point linings 15 are selectively fused to one another while the high melting point linings 14 remain in a hardened condition. By cutting the terminals 5, 6 and 18, a semiconductor device as shown in FIGS. 4A and 4B will be obtained.

FIGS. 5 and 6 show another embodiment of the invention. In FIG. 5, a grown diffused type semiconductor element 24 is fixed to opposing terminals 22 and 23 of a strip of metal plate 21 such as shown in FIG. 1, so that the junction of the element 24 is situated between the terminals, and a base lead wire 25 is then connected from the junction of the element 24 to a terminal 26. In FIGS. 6A and 6B, any of the pairs of containers in FIG. 2 are joined onto both sides of the strip of metal 21 to case the semiconductor element, which is then sealed hermetically by heat-fusing the glass lined peripheries. After sealing, the required semiconductor devices may be obtained by cutting terminals 27, 28 and 29 in the manner explained in conjunction with the above embodiment.

Further embodiments of the invention will now be described with reference to FIGS. 7 to 9 inclusive. Referring at first to FIG. 7A, a number of openings such as 32 are punched in a strip of metal plate 30 with a finger 31 projecting into the opening. An alloyed type transistor element is affixed to finger 31, as shown more clearly in FIG. 7B. As shown in FIGS. 8A and 8B, metallic ribbons 34 and 35 are welded to the respective faces of a strip of metal plate, and are connected to the collector electrode 36 and emitter electrode 37, respectively, of the transistor element. On this occasion, it is desirable for the metallic ribbons to be formed into a suitable shape with offset end portions as seen in FIG. 8B, so that they may not contact or short circuit to the base retaining electrode of the transistor element.

FIGS. 9A and 9A′ show a plan and a section of dish-shaped and disc-shaped ceramic containers 38 and 39. FIGS. 9B and 9B′ show a plan and a section of dish-shaped and disc-shaped metal container portions 42 and 43, the peripheries of which are provided with glass linings 40 and 41. As shown in FIG. 10, the electrodes of the transistor element are protected in both sides with silicon resins 44 and 45, and then either of the containers shown in FIGS. 9A or 9B are joined together with organic binding agent 46 so as to enclose the transistor element. After that, the required semiconductor devices may be obtained by cutting the terminals thereof in the same way as in the embodiments described above.

As an example of a mass production method according to this invention, a mass production method of diffused type transistors will be explained fully with reference to FIG. 11. A strip of metal plate 47 is fed forward from a bulky roll by feeding rollers 48. Automatic press 49 perforates the plate with openings and inwardly projecting fingers as described above. The perforated strip is subjected to vaporizing removal of grease at a next stage 50, is pickled in a pickling bath 51, is plated with gold in a plating bath 52, and then is washed with water in a washing bath 53.

Subsequently, the washed strip passes a drier 54, and then a gold alloy strip and a semiconductor element are successively placed upon one terminal in each opening of the metal plate at a position 55. Each element is attached to the terminal by fusing while passing through a tunnel furnace 56. At a position 57 each of the other terminals is connected to the semiconductor electrodes by thermal compression bonding. At a position 58 the containers which have been provided with glass linings as shown in FIG. 2, are put together from upper and lower sides of the metal plate, and then are sealed hermetically by heat-fusing while passing through a tunnel furnace 59. After cutting the emitter and the base terminal free from the metal plate by an automatic cutting tool 60, the characteristics of the elements are determined by an automatic sorter or classifier 61, thereby signals representing the quality and the grade of the elements are sent to cutters 62, 63, 64 and 65, and to the marking heads 66, 67 and 68. A transistor determined as inferior by the automatic sorter or classifier 61 is finally cut away by the cutter 62 and collected in a housing box 69 for the inferior transistors. While, a transistor determined for grade "A" by the automatic sorter or classifier 61 is stamped with the mark grade "A" by the marking head 66, and as soon as it has been finally cut away by the cutter 63, it is attached to a wrapping adhesive tape 70 passing beneath the metal plate. The tape 70 is then moved a short distance to receive the next grade "A" transistor.

A transistor determined for grade "B" in the same sorter or classifier 61 is stamped with the mark of grade "B" by the marking head 67, and as soon as it has been finally cut away by the cutter 64, it is attached to a wrapping adhesive tape 71 passing beneath the metal plate. A transistor of grade "C" is similarly attached to a tape 72 after passing through the marking head 68 and the cutter 65. After that, the tapes 70, 71 and 72 are passed through a drier 73 for drying the marking ink, and dried. Then the adhesive faces of tapes 70, 71 and 72, are attached to other tapes 74, 75 and 76, and then are wound on reels 77, 78 and 79, respectively. While this embodiment is of the type of a continuous operation from processing a metallic roll to wrapping transistors as final products, the whole operation may be divided at intermediate stages for the purpose of balancing the time index of the operation, with the metal plate wound on drums or reels.

From the foregoing description it will be apparent that this invention provides a simple and inexpensive method of manufacturing semiconductor devices. And it should be understood that this invention is by no means limited to the specific embodiments disclosed herein, since many modifications can be made in the disclosed structure without departing from the basic teaching of this invention. For example, rectangular openings could be formed in the metal strip in place of the round openings disclosed in the drawings, and diodes could be assembled on the projecting fingers in place of the transistors disclosed in the drawings. These and many other modifications of the invention will be apparent to those skilled in the art, and this invention includes all modifications falling within the scope of the following claims.

We claim:

1. A method of continuously manufacturing semiconductor devices from a strip of conducting material and a plurality of semiconductor elements, said method comprising the steps of (A) forming in said conducting material a plurality of openings having inwardly projecting fingers, (B) attaching said semiconductor elements to corresponding ones of said inwardly projecting fingers, (C) forming conductors between said semiconductor elements and corresponding other ones of said inwardly projecting fingers, (D) removing said inwardly projecting fingers from said strip of conducting material to form a plurality of operable semiconductor devices, and (E) testing the electrical characteristics of said devices.

2. A method of continuously manufacturing semiconductor devices from a strip of conducting material and a plurality of semiconductor elements and cap members for encapsulating said semiconductor elements, said method comprising the steps of (A) forming in said conducting material a plurality of openings, having inwardly projecting fingers, (B) attaching said semiconductor elements to corresponding ones of said inwardly projecting fingers, (C) forming conductors between said semiconductor elements and corresponding other ones of said inwardly projecting fingers, (D) encapsulating said semiconductor elements with said cap members, (E) removing said inwardly projecting fingers from said strip of conducting material to form a plurality of operable semiconductor devices and (F) testing the electrical characteristics of said devices.

3. A method of continuously manufacturing semiconductor devices from a strip of conducting material and a plurality of semiconductor elements and cap members for encapsulating said semiconductor elements, said method comprising the steps of (A) forming in said conducting material a plurality of openings having inwardly projecting fingers, (B) attaching said semiconductor elements to corresponding ones of said inwardly projecting fingers, (C) attaching conductors between said semiconductor elements and corresponding other ones of said inwardly projecting fingers, (D) encapsulating said semiconductor elements with said cap members, (E) removing said inwardly projecting fingers from said strip of conducting material to form a plurality of operable semiconductor devices, and (F) testing the electrical characteristics of said devices.

4. A method of manufacturing semiconductor devices from a strip of conducting material and a plurality of semiconductor elements and cap members for encapsulating said semiconductor elements, said method comprising the steps of (A) forming in said conducting material a plurality of openings having inwardly projecting fingers, (B) attaching said semiconductor elements to corresponding ones of said inwardly projecting fingers, (C) attaching conductors between said semiconductor elements and corresponding other ones of said inwardly projecting fingers, (D) encapsulating said semiconductor elements with said cap members, (E) cutting at least one but less than all of said inwardly projecting fingers, (F) applying electrical voltages between one of said cut inwardly projecting fingers and another inwardly projecting finger of the same opening to test the conductivity of the semiconductor element therein, (G) marking the encapsulated semiconductor material in accordance with the results of said test, and (H) cutting all of the uncut inwardly projecting fingers from each of said openings to form a plurality of operable semiconductor devices.

5. A method of manufacturing semiconductor devices from a strip of conducting material and a plurality of semiconductor elements and cap members for encapsulating said semiconductor elements, said method comprising the steps of (A) forming in said conducting material a plurality of openings having inwardly projecting fingers, (B) attaching said semiconductor elements to corresponding ones of said inwardly projecting fingers, (C) encapsulating said semiconductor elements with said cap members, said encapsulating step comprising lining predetermined areas of said cap members with a low melting point glass and fusing said glass linings while contacting cooperating ones of said cap members to each other at said predetermined areas, and (D) removing said inwardly projecting fingers from said strip of conducting material to form a plurality of operable semiconductor devices.

6. A method of manufacturing semiconductor devices from a strip of conducting material and a plurality of semiconductor elements and metallic cap members for encapsulating said semiconductor elements, said method comprising the steps of (A) forming in said conducting material a plurality of openings having inwardly projecting fingers, (B) attaching said semiconductor elements to corresponding ones of said inwardly projecting fingers, (C) encapsulating said semiconductor elements with said cap members, said encapsulating step comprising lining predetermined areas of said cap members with a high melting point glass, forming low melting point glass linings on said high melting point glass linings and selectively fusing said low melting point glass linings while fixing cooperating ones of said cap members to each other at said predetermined areas, and (D) removing said inwardly projecting fingers from said strip of conducting material to form a plurality of operable semiconductor devices.

7. A method of manufacturing semiconductor devices from a strip of conducting material and a plurality of semiconductor elements and cap members for encapsulating said semiconductor elements, said method comprising the steps of (A) forming in said conducting material a plurality of openings having inwardly projecting fingers, (B) attaching said semiconductor elements to corresponding ones of said inwardly projecting fingers, (C) encapsulating said semiconductor elements with said cap members, said encapsulating step comprising applying an organic cement to the peripheries of said cap members and fixing cooperating ones of said cap members to each other at said peripheries, and (D) removing said inwardly projecting fingers from said strip of conducting material to form a plurality of operable semiconductor devices.

8. A method of manufacturing semiconductor devices from a strip of conducting material and a plurality of semiconductor elements and metallic cap members for encapsulating said semiconductor elements, said method comprising the steps of (A) forming in said conducting material a plurality of openings having inwardly projecting fingers, (B) attaching said semiconductor elements to corresponding ones of said inwardly projecting fingers, (C) encapsulating said semiconductor elements with said cap members, said encapsulating step comprising lining predetermined areas of said cap members with glass, applying an organic cement to said glass linings and fixing cooperating ones of said cap members to each other at said predetermined areas, and (D) removing said inwardly projecting fingers from said strip of conducting material to form a plurality of operable semiconductor devices.

References Cited by the Examiner

UNITED STATES PATENTS

| | | | |
|---|---|---|---|
| 2,627,545 | 2/53 | Muss | 29—25.3 X |
| 2,900,584 | 8/54 | Bottom | 317—235 |
| 2,985,806 | 5/61 | McMahon. | |
| 3,061,766 | 10/62 | Kelley. | |
| 3,065,525 | 11/62 | Ingraham et al. | |

FOREIGN PATENTS

| | | |
|---|---|---|
| 809,877 | 11/56 | Great Britain. |

RICHARD H. EANES, Jr., *Primary Examiner.*